(12) United States Patent
Lombardo et al.

(10) Patent No.: US 11,550,231 B2
(45) Date of Patent: Jan. 10, 2023

(54) APPARATUS FOR AND METHOD OF IN-SITU PARTICLE REMOVAL IN A LITHOGRAPHY APPARATUS

(71) Applicant: ASML Holding N.V., Veldhoven (NL)

(72) Inventors: Jeffrey John Lombardo, Roxbury, CT (US); Ronald Peter Albright, Norwalk, CT (US); Daniel Leslie Hall, San Diego, CA (US); Victor Antonio Perez-Falcon, Bridgeport, CT (US); Andrew Judge, Monroe, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 17/418,478

(22) PCT Filed: Dec. 12, 2019

(86) PCT No.: PCT/EP2019/084831
§ 371 (c)(1),
(2) Date: Jun. 25, 2021

(87) PCT Pub. No.: WO2020/136013
PCT Pub. Date: Jul. 2, 2020

(65) Prior Publication Data
US 2022/0075277 A1    Mar. 10, 2022

Related U.S. Application Data

(60) Provisional application No. 62/785,369, filed on Dec. 27, 2018.

(51) Int. Cl.
*G03F 7/20* (2006.01)

(52) U.S. Cl.
CPC ...... *G03F 7/70875* (2013.01); *G03F 7/70925* (2013.01)

(58) Field of Classification Search
CPC .................. G03F 7/70875; G03F 7/70925
(Continued)

(56) References Cited

U.S. PATENT DOCUMENTS

| 6,727,980 B2 * | 4/2004 | Ota ..................... G03F 7/70258 |
| | | 430/311 |
| 7,323,698 B2 * | 1/2008 | Sogard ................ G03F 7/70916 |
| | | 355/75 |

(Continued)

FOREIGN PATENT DOCUMENTS

WO    WO 2016/142370 A1    9/2016

OTHER PUBLICATIONS

International Search Report and Written Opinion of the International Searching Authority directed to related International Patent Application No. PCT/EP2019/084831, dated Apr. 7, 2020; 10 pages.

(Continued)

*Primary Examiner* — Hung V Nguyen
(74) *Attorney, Agent, or Firm* — Sterne, Kessler, Goldstein & Fox P.L.L.C.

(57) ABSTRACT

Methods and systems are described for reducing particulate contaminants on a clamping face of a clamping structure in a lithographic system. A substrate such as a cleaning reticle is pressed against the clamping face. A temperature differential is established between the substrate and the clamping face either before or after clamping occurs to facilitate transfer of particles from the clamping face to the substrate.

19 Claims, 8 Drawing Sheets

(58) Field of Classification Search
USPC .................................................. 355/72–76
See application file for complete search history.

(56) References Cited

U.S. PATENT DOCUMENTS

| | | | | |
|---|---|---|---|---|
| 7,477,358 | B2* | 1/2009 | Phillips | ............... G03F 7/70741 |
| | | | | 355/75 |
| 8,007,591 | B2* | 8/2011 | Hamelin | ............... C23C 16/466 |
| | | | | 156/345.52 |
| 9,337,067 | B2* | 5/2016 | Roy | .................... H01L 21/6831 |
| 11,011,355 | B2* | 5/2021 | Mertke | ............. H01J 37/32697 |
| 2006/0066834 | A1 | 3/2006 | Phillips et al. | |
| 2006/0162739 | A1 | 7/2006 | Sogard | |
| 2016/0035605 | A1 | 2/2016 | Schmitz et al. | |
| 2019/0201945 | A1 | 7/2019 | Tokashiki et al. | |

OTHER PUBLICATIONS

International Preliminary Report on Patentability directed to related International Patent Application No. PCT/EP2019/084831, dated Jun. 16, 2021; 8 pages.

\* cited by examiner

APPARATUS FOR AND METHOD OF IN-SITU PARTICLE REMOVAL IN A LITHOGRAPHY APPARATUS

CROSS-REFERENCE TO RELATED APPLICATIONS

This application claims priority of U.S. Provisional Patent Application No. 62/785,369, which was filed on Dec. 27, 2018, and which is incorporated herein in its entirety by reference.

FIELD

The present disclosure relates to methods and systems for removing contamination from the vicinity of a support such as a clamping structure, e.g., an electrostatic chuck that is used to hold a device such as a reticle, mask, or wafer inside a lithography apparatus.

BACKGROUND

A lithographic apparatus is a machine that applies a desired pattern onto a substrate such as a wafer of semiconductor material, usually onto a target portion of the substrate. A patterning device, which is alternatively referred to as a mask or a reticle, may be used to generate a circuit pattern to be formed on an individual layer of the wafer. Transfer of the pattern is typically accomplished by imaging onto a layer of radiation-sensitive material (resist) provided on the substrate. In general, a single substrate will contain adjacent target portions that are successively patterned.

In order to shorten the exposure wavelength and, thus, reduce the minimum printable size, electromagnetic radiation having a wavelength within the range of about 5 nm to about 20 nm, for example within the range of about 13 nm to about 14 nm, is used. Such radiation is termed extreme ultraviolet (EUV) radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a small quantity of fuel, such as droplets of a suitable fuel material (e.g., Sn) or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source. In an alternative system, which may also employ the use of a laser, radiation may be generated by a plasma formed by the use of an electrical discharge—a discharge produced plasma (DPP) source. The radiation once produced is patterned using a patterning device and then conveyed to the surface of a wafer.

A clamping structure in the form of an electrostatic chuck (ESC) is used in a lithography apparatus, for example, to hold a patterning reticle on a scanning stage. Reticle particle contamination (defectivity) is a key critical parameter in EUV technology. In order to mitigate reticle contamination, the volume near the reticle stage may be cleaned by so-called flushing. Flushing involves providing a higher than normal gas flow in the reticle area to release (dislodge) particles and remove them from the EUV system. Flushing, however, is a relative slow cleaning process and has only a limited efficiency.

The clamping structure may be also be cleaned by so-called "reticle stamping" in which a reticle, which may be a sacrificial reticle, presses against the clamping structure and is then withdrawn. Here and elsewhere, it will be understood that the phrase "presses against the clamping structure" encompasses circumstances in which pressing is caused by a clamping force. This process causes particles on the clamping structure to be transferred to the reticle.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect, there is disclosed a system in which a temperature differential is created a clamping structure and an article such as a reticle positioned to confront the clamping structure. The temperature differential may be created by heating the article but not the clamping structure, by cooling the article not the clamping structure, by heating the clamping structure but not the article, by cooling the clamping structure but not the article, or by other differential heating/cooling of the article and clamping structure.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWING

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
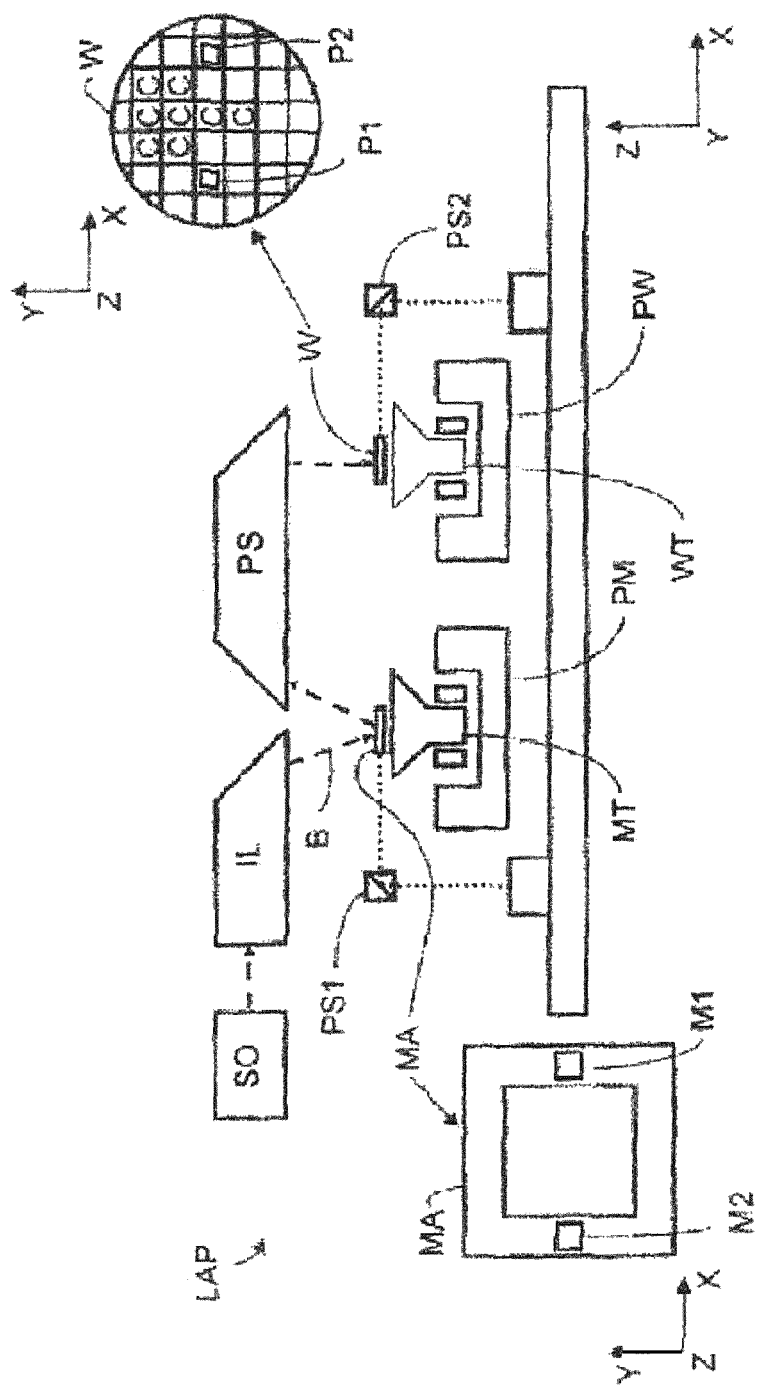
FIG. 1 shows a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

In the description that follows and in the claims the terms "up," "down," "top," "bottom," "vertical," "horizontal," and like terms may be employed. These terms are intended to show relative orientation only and not any absolute orientation such as orientation with respect to gravity unless otherwise intended as indicated. Similarly, terms such as left, right, front, back, etc., are intended to give only relative orientation.

Before describing embodiments in more detail, it is instructive to present an example environment in which embodiments of the present invention may be implemented.

FIG. 1 schematically shows a lithographic apparatus LAP including a source collector module SO according to an embodiment of the present invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g., employing a reflective mask). The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam and exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as faceted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of several modes. For example, in a step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

In a scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-magnification and image reversal characteristics of the projection system PS.

In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
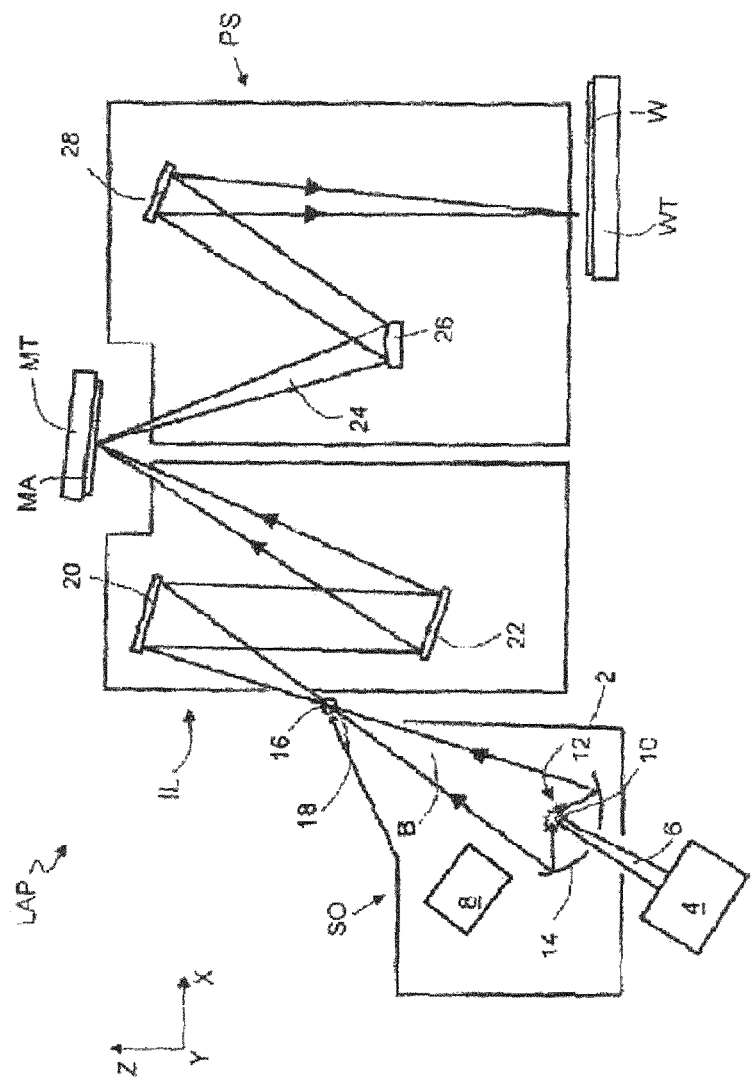
FIG. 2 is a more detailed view of the apparatus of FIG. 1, including an LPP source collector module, according to an embodiment.

FIG. 2 shows the lithographic apparatus LAP in more detail, including the source collector module SO, the illumination system IL, and the projection system PS. The source collector module SO is constructed and arranged such that a vacuum environment can be maintained in an enclosing structure 2 of the source collector module.

A laser 4 is arranged to deposit laser energy via a laser beam 6 into a volume of fuel, such as xenon (Xe), tin (Sn) or lithium (Li) that is provided from a fuel supply 8 (sometimes referred to as a fuel stream generator). The deposition of laser energy into the fuel creates a highly ionized plasma 10 at a plasma formation location 12 that has electron temperatures of several tens of electron volts (eV). The energetic radiation generated during de-excitation and recombination of these ions is emitted from the plasma 10, collected and focused by a near normal incidence radiation collector 14. A laser 4 and a fuel supply 8 (and/or a collector 14) may together be considered to comprise a radiation source, specifically an EUV radiation source. The EUV radiation source may be referred to as a laser produced plasma (LPP) radiation source.

A second laser (not shown) may be provided, the second laser being configured to preheat or otherwise precondition the volume of fuel before the laser beam 6 is incident upon it. An LPP source that uses this approach may be referred to as a dual laser pulsing (DLP) source.

Although not shown, the fuel stream generator will generally comprise, or be in connection with, a nozzle configured to direct a stream of fuel, for example in the form of droplets, along a trajectory towards the plasma formation location 12.

Radiation B that is reflected by the radiation collector 14 is focused at a virtual source point 16. The virtual source point 16 is commonly referred to as the intermediate focus, and the source collector module SO is arranged such that the intermediate focus 16 is located at or near to an opening 18 in the enclosing structure 2. The virtual source point 16 is an image of the radiation emitting plasma 10.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

More elements than shown may generally be present in the illumination system IL and projection system PS. Furthermore, there may be more mirrors present than those shown in the figures, for example there may be additional reflective elements present in the projection system PS than shown in FIG. 2.

Embodiments as described herein may be used for contamination control in many different lithography tools, including in an extreme ultra-violet (EUV) lithography device. EUV reticles, being reflective by nature, are very vulnerable to contamination, and are difficult to clean using manual procedures.

Currently methods of clamping structure cleaning/stamping are generally carried out at ambient conditions within the tool. According to one aspect of a disclosed embodiment, a temperature differential is created to promote transfer of particles from the clamping structure to the article. In the case where the article is a reticle, the temperature differential promotes transfer particles from the clamping structure to the reticle during the reticle cleaning/stamping process. The adhesive properties of particles on a material are temperature dependent, and modification of the temperature of one substrate with respect to the other can increase or decrease the strength of the force by which a particle is attached to a surface. Depending on the particles involved it may be desirable to heat/cool the reticle, heat/cool the clamping structure, or some combination of these.

The temperature differential may be created and/or maintained in any one of a number of ways. In the examples which follow, the article is a reticle, but it will be understood that the examples may be adapted for other situations in which it is desired to clean a clamping structure surface. For example, a radio frequency signal, for example, the MHZ frequency signal, can be driven through the reticle stage clamping structure, with or without a reticle on the clamping structure, to induce heating in the clamping structure. The reticle would then be introduced to the clamping structure in an unheated condition.

Figure 3:
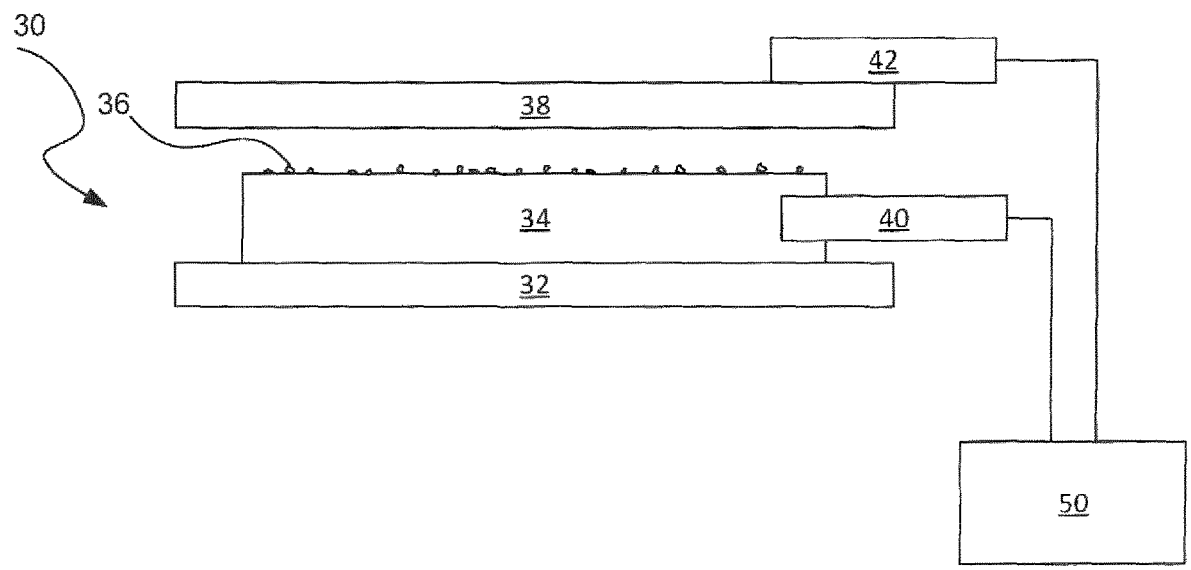
FIG. 3 is a not-to-scale diagram of an arrangement for cleaning a clamping structure surface using a cleaning substrate and temperature differential according to an aspect of an embodiment.

Such an arrangement is shown in FIG. 3. The lithographic apparatus includes a clamping structure 30 made up of a support structure (e.g., reticle table) 32 configured to hold the reticle using, for example, mechanical, vacuum, electrostatic or other clamping techniques. The support structure 32 has a working surface 34 configured to support corresponding portions of the reticle. The working surface 34 may be provided with a group of burls, in which case FIG. 3 may be regarded as showing one of the burls.

As shown in FIG. 3, the working surface 34 can become contaminated with particles 36. To remove the particles, a cleaning substrate 38, which may be a sacrificial reticle, is loaded onto the clamping structure 30. As an example, cleaning substrate 38 will be referred to herein as a cleaning reticle but it will be understood that other types of substrates may be used. A compressive force between the top of the working surface 34 and the bottom of the cleaning reticle 38, which may be an electrostatic force in the case where the clamping structure 30 is an electrostatic chuck, causes the particles 36 to be transferred from the top of working surface 34 to the bottom of the cleaning reticle 38. The cleaning reticle 38 is then moved away, taking the contaminants 36 with it.

Also shown in FIG. 3 is a module 40 for controlling the temperature of the clamping structure 30 and a module 42 for controlling the temperature of the reticle 38. Both modules may be present or only one of the modules may be present. The modules may be cooling modules or may be heating modules or one module may be a heating module while the other module could be a cooling module. The module 40 is in thermal communication with the clamping structure 30, that is, is arranged so that heat may flow between the clamping structure 30 and the module 40. The heat may flow by any one of a number of mechanisms including conduction, convection, and radiation. Similarly the module 42 is in thermal communication with the reticle 38, that is, is arranged so that heat may flow between the reticle 38 and the module 42. Again, the heat may flow by any one of a number of mechanisms including conduction, convection, and radiation. The module 40 and the module 40 operate under control of a control unit 50.

Figure 4:
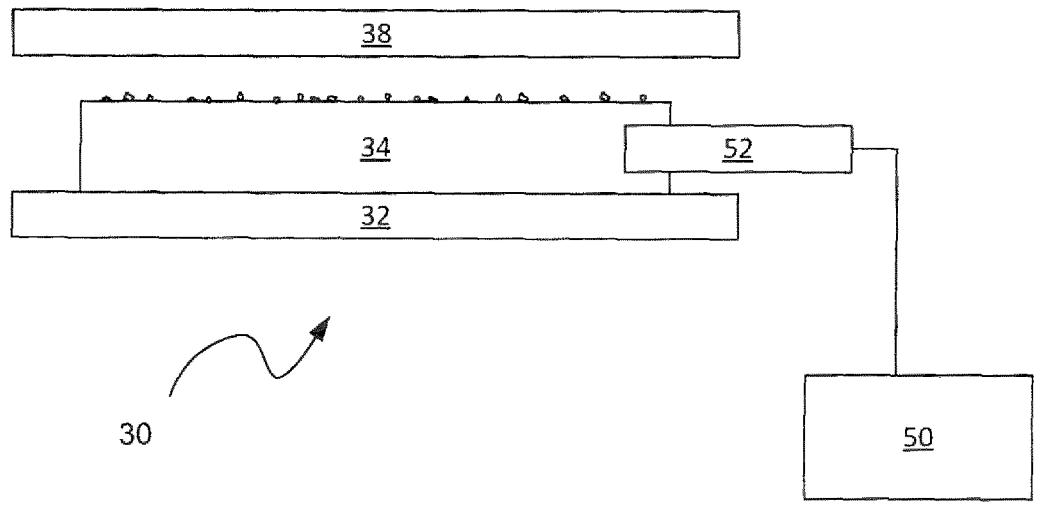
FIG. 4 is a not-to-scale diagram of another arrangement for cleaning a clamping structure surface using a cleaning substrate and temperature differential according to an aspect of an embodiment.

As another example, as shown in FIG. 4, a signal having, for example, an RF component, could be driven through the reticle stage clamping structure 30 to induce heating in the clamping structure 30. A radio frequency coupling unit 52 couples radio frequency energy into the clamping structure 30 under control of a control unit 50. An impedance may be included in the clamping structure 30 to facilitate coupling of energy into the clamping structure 30. The RF component could be driven through the reticle stage clamping structure 30 while a reticle is clamped on to the structure to induce heating at the interface between the clamping structure 30 and the reticle 38. Alternatively, or in addition, the RF signal could be used to heat the clamping structure prior to introduction of an unheated reticle, and/or upon release of the reticle.

Figure 5:
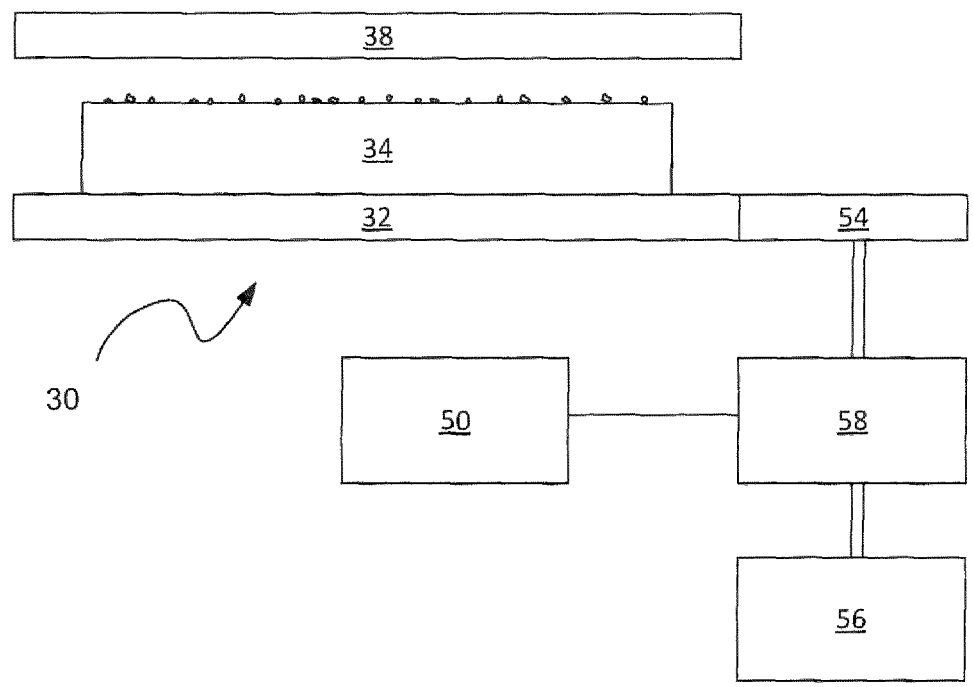
FIG. 5 is a not-to-scale diagram of another arrangement for cleaning a clamping structure surface using a cleaning substrate and temperature differential according to an aspect of an embodiment.

As another example, as shown in FIG. 5, EUV light may be applied to the clamping structure 30 while the flow of coolant, for example cooling water, to the clamping structure 30 from the source 56 to a coupler 54 is reduced or disabled by a valve 58 to induce heating in the clamping structure 30. The reticle 38 could then be introduced to the clamping structure 30 in an unheated condition. Also, the temperature of the cooling water may be increased to cause heating.

Figure 6:
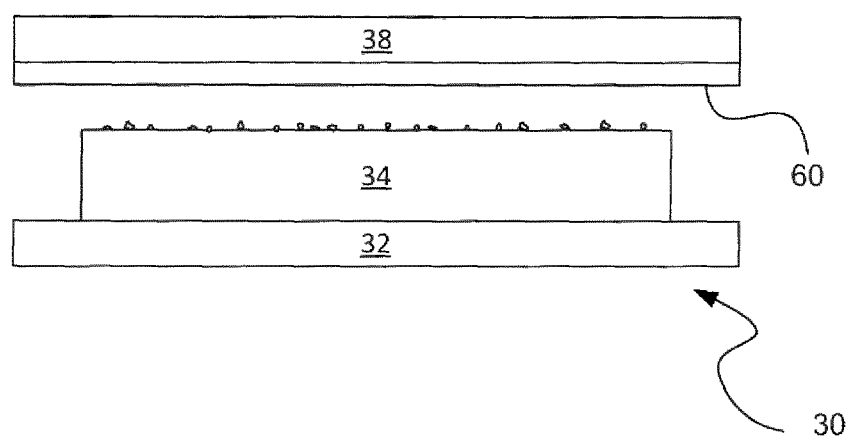
FIG. 6 is a not-to-scale diagram of another arrangement for cleaning a clamping structure surface using a cleaning substrate and temperature differential according to an aspect of an embodiment.

As another example, as shown in FIG. 6, a highly absorbing coating 60 can be placed on the reticle 38 to absorb EUV light thus increasing the temperature of the reticle 38. This heating may be done while the reticle 38 is on the clamping structure 30. A temperature gradient would be driven by the finite thermal resistance between the reticle 38 and clamping structure 30.

Figure 7:
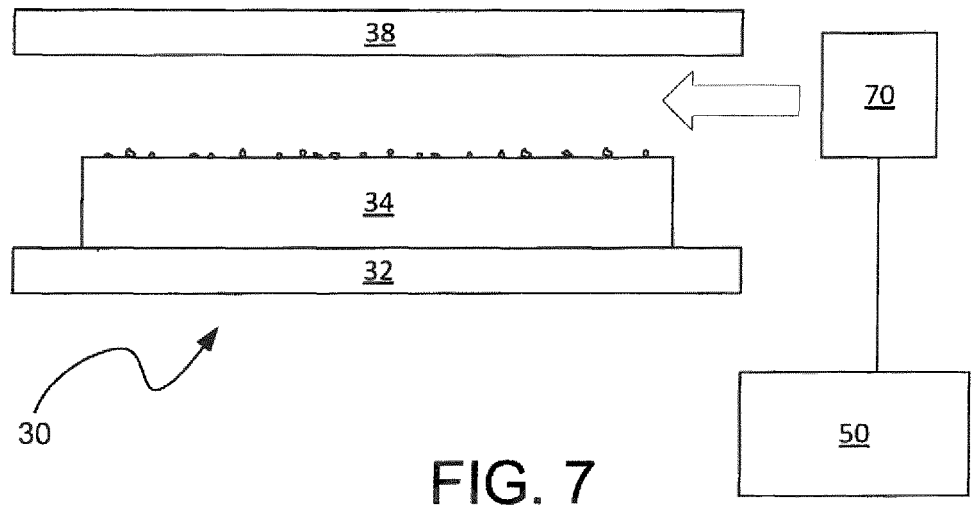
FIG. 7 is a not-to-scale diagram of another arrangement for cleaning a clamping structure surface using a cleaning substrate and temperature differential according to an aspect of an embodiment.

As yet another example, as shown in FIG. 7, a flow of gas such as from a backside gas distribution system 70 on the backside of the reticle 38 can be turned off by a control unit 50 while EUV light is focused on the reticle 38. This heating could be carried out while the reticle 38 is on the clamping structure 30. The temperature gradient would be driven by the finite thermal resistance between the reticle 38 and clamping structure 30.

Figure 8:
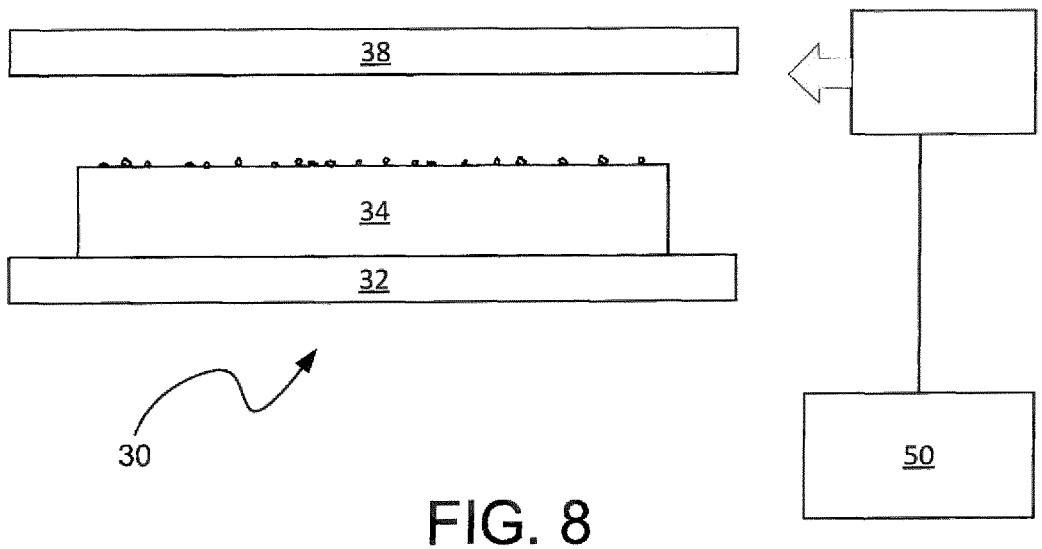
FIG. 8 is a not-to-scale diagram of another arrangement for cleaning a clamping structure surface using a cleaning substrate and temperature differential according to an aspect of an embodiment.

As another example, as shown in FIG. 8, flows near the reticle 38 can be heated externally to the system by a heater 80 under control of a control unit 50 and then flowed over the front side of the reticle 38. The temperature gradient would be induced by heating the reticle 38 in this manner but not the clamping structure 30.

Figure 9:
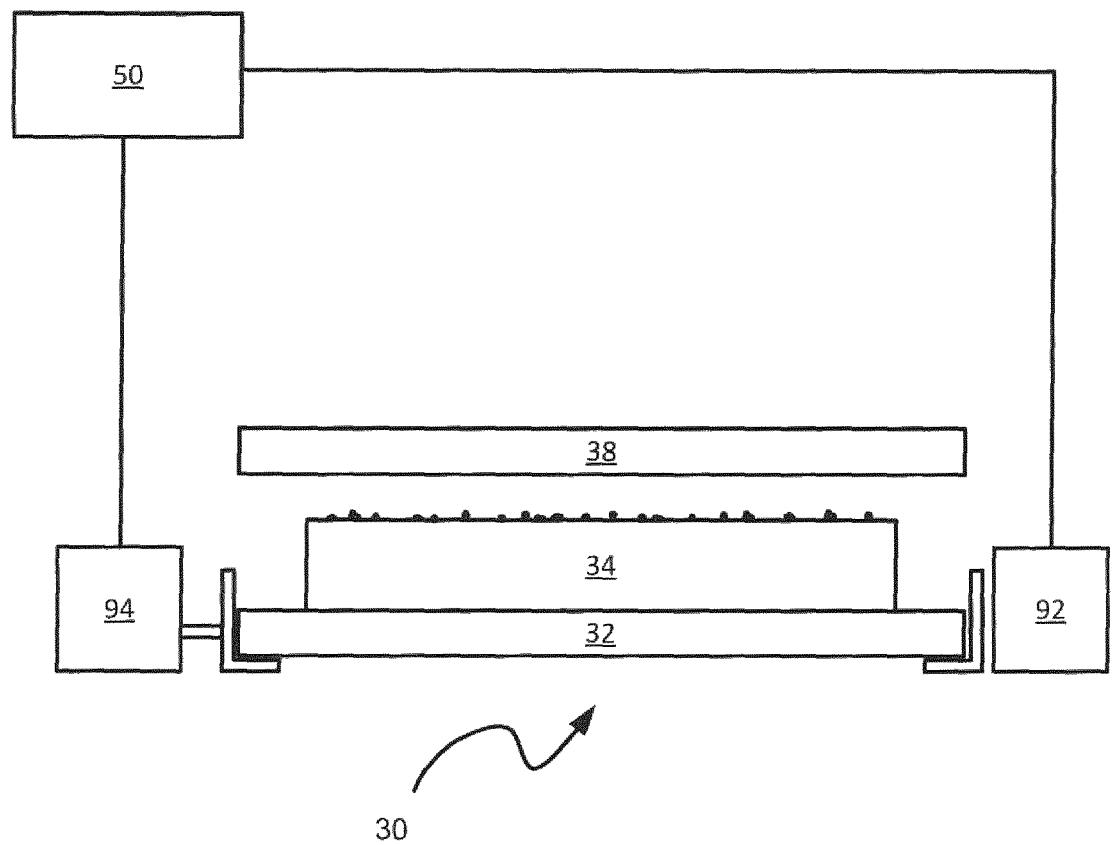
FIG. 9 is a not-to-scale diagram of another arrangement for cleaning a clamping structure surface using a cleaning substrate and temperature differential according to an aspect of an embodiment.

As another example, as shown in FIG. 9, cooling water to the reticle stage 30 from a cooling water supply 92 can be reduced or turned off and then the reticle stage motors 94 could be operated to generate heat in the reticle stage 90. A temperature gradient would be induced by heating the reticle stage 30.

Figure 10:
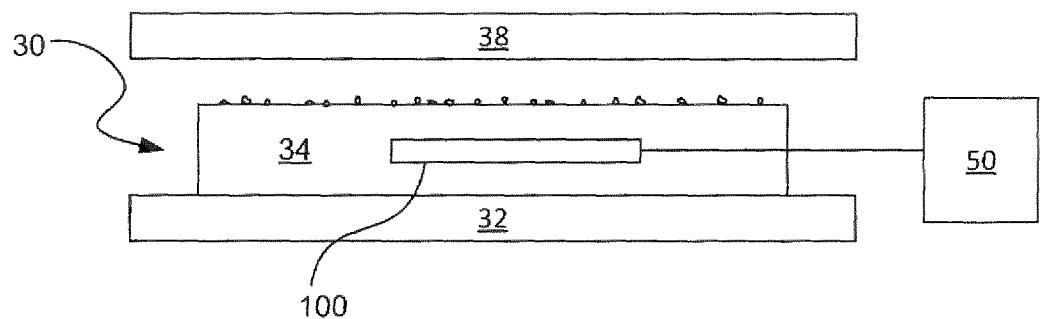
FIG. 10 is a not-to-scale diagram of another arrangement for cleaning a clamping structure surface using a cleaning substrate and temperature differential according to an aspect of an embodiment.

As another example, as shown in FIG. 10, the clamping structure 30 could be provided with resistive heaters 100 within the working surface 34 to control the local temperature in the clamping structure 30. In the case where the working surface is provided with a group of burls, resistive heaters could be located in one or more of the burls.

Figure 11:
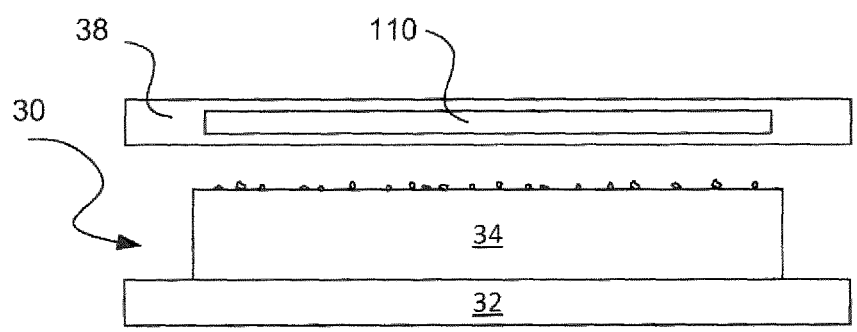
FIG. 11 is a not-to-scale diagram of another arrangement for cleaning a clamping structure surface using a cleaning substrate and temperature differential according to an aspect of an embodiment.

As another example, as shown in FIG. 11, a dedicated reticle 38 could be provided with the internal temperature control module 110 such as a battery driven resistance heater or a battery driven cooler.

The backside of the reticle 38, that is, the surface of reticle 38 facing clamping structure 30, may be provided with a polymer coating to facilitate cleaning. Typically, the adhesive properties of such polymers increase as a function of temperature and then fall off rapidly. The heating and cooling systems described above can be used to control the temperature of the polymer coating for optimal adhesion of particulate contaminants.

The embodiments may further be described using the following clauses:

1. Apparatus comprising:
    a cleaning substrate;
    a clamping structure configured to secure the cleaning substrate; and
    a temperature control unit in thermal communication with one of the cleaning substrate and the clamping structure and configured to induce a temperature differential between the cleaning substrate and the clamping structure.
2. Apparatus of clause 1 wherein the cleaning substrate is a cleaning reticle.
3. Apparatus of clause 2 wherein the temperature control unit is in thermal communication with the cleaning reticle.
4. Apparatus of clause 2 wherein the temperature control unit is in thermal communication with the clamping structure.
5. Apparatus of clause 2 wherein the temperature control unit is in thermal communication with the cleaning reticle and further comprising a second temperature control unit in thermal communication with the clamping structure.
6. Apparatus of clause 2 wherein the temperature control unit is a module for coupling radio frequency energy into the clamping structure.
7. Apparatus of clause 2 further comprising a source of coolant selectably coupled to the clamp and wherein the clamp is arranged to be selectably warmed by radiation, the temperature control unit comprising a valve for controlling coupling between the source of coolant and the clamping structure.
8. Apparatus of clause 7 wherein the radiation is EUV radiation.
9. Apparatus of clause 2 wherein the temperature control unit comprises a radiation absorbing coating on a surface of the cleaning reticle facing away from the clamping structure and wherein the surface of the cleaning reticle is arranged to be selectably irradiated by radiation.
10. Apparatus of clause 9 wherein the warming radiation is EUV radiation.
11. Apparatus of clause 2 further comprising a gas system for selectably causing a flow of gas across a surface of the cleaning reticle facing away from the clamping structure and wherein the temperature control unit comprises a module for controlling the gas system to alter a flow rate of the gas.
12. Apparatus of clause 11 wherein the temperature control unit comprises a module for controlling the gas system substantially stops the flow of gas.
13. Apparatus of clause 2 further comprising a gas system for selectably causing a flow of gas across a surface of the cleaning reticle facing the clamping structure and wherein the temperature control unit comprises a module for heating the gas.
14. Apparatus of clause 2 further comprising a reticle stage for supporting the cleaning reticle, at least one motor for driving the reticle stage, and a source of coolant selectably coupled to the reticle stage and wherein the temperature control unit comprises a module for operating the at least one motor to generate heat and a valve for controlling coupling between the source of coolant and the reticle stage.
15. Apparatus of clause 2 wherein the temperature control unit comprises at least one resistive heater within the clamping structure.
16. Apparatus of clause 15 wherein the clamping structure comprises a clamping surface comprises a plurality of raised surface features, and wherein temperature control unit comprises at least one resistive heater in at least some of the plurality of raised surface features.
17. Apparatus of clause 2 wherein the temperature control unit comprises at least one resistive heater within the cleaning reticle.
18. Apparatus of clause 17 wherein the cleaning reticle comprises a battery electrically coupled to the resistive heater.
19. Apparatus of clause 2 wherein the temperature control unit comprises at least one electrical cooling element within the cleaning reticle.
20. Apparatus of clause 19 wherein the cleaning reticle comprises a battery electrically coupled to the electrical cooling element.
21. A method of removing a particulate contaminant from a clamping face in a lithographic system, the method comprising the steps of:
    positioning a cleaning reticle adjacent to the clamping face;
    generating a force pressing the cleaning reticle against the clamping face; and
    moving the cleaning reticle away from the clamping face;
    wherein a temperature differential is established between the cleaning reticle and the clamping face.
22. A method of clause 21 wherein the temperature differential is established after the force generating step.
23. A method of clause 21 wherein the temperature differential is established before the force generating step.
24. A method of clause 21 wherein the clamping face is a clamping face of an electrostatic chuck and wherein the force generating step comprises energizing the electrostatic chuck.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "reticle" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The invention claimed is:

1. An apparatus for reducing particulate contaminants on a clamping face of a clamping structure in a lithographic system comprising:
   a cleaning substrate positioned opposite to the clamping face, wherein the clamping structure is configured to secure the cleaning substrate; and
   a temperature control unit in thermal communication with one of the cleaning substrate and the clamping structure, and configured to induce a temperature differential between the cleaning substrate and the clamping structure so as to attract the particulate contaminants on the clamping face to the cleaning substrate,
   wherein the temperature control unit is in thermal communication with the cleaning substrate and further comprises a second temperature control unit in thermal communication with the clamping structure.

2. The apparatus of claim 1, wherein the cleaning substrate is a cleaning reticle.

3. The apparatus of claim 2, wherein the temperature control unit is in thermal communication with the cleaning reticle.

4. The apparatus of claim 1, wherein the temperature control unit is in thermal communication with the clamping structure.

5. The apparatus of claim 2, wherein the temperature control unit is configured to couple radio frequency energy into the clamping structure.

6. The apparatus of claim 2, further comprising a source of coolant selectably coupled to the clamping structure and wherein the clamping structure is arranged to be selectably warmed by radiation, and wherein the temperature control unit comprises a valve to control coupling between the source of coolant and the clamping structure.

7. The apparatus of claim 6, wherein the radiation is EUV radiation.

8. The apparatus of claim 2, wherein the temperature control unit comprises a radiation absorbing coating on a surface of the cleaning reticle facing away from the clamping structure and wherein the surface of the cleaning reticle is arranged to be selectably irradiated by radiation.

9. The apparatus of claim 8, wherein the radiation is EUV radiation.

10. The apparatus of claim 2, further comprising a gas system configured to selectably causing a flow of gas across a surface of the cleaning reticle facing away from the clamping structure and wherein the temperature control unit is configured to control the gas system to alter a flow rate of the gas.

11. The apparatus of claim 10, wherein the temperature control unit comprises a module for controlling the gas system to substantially stop the flow of gas.

12. The apparatus of claim 2, further comprising a gas system configured to selectably causing a flow of gas across a surface of the cleaning reticle facing the clamping structure and wherein the temperature control unit comprises a module configured to heat the gas.

13. The apparatus of claim 2, further comprising a reticle stage for supporting the cleaning reticle, at least one motor configured to drive the reticle stage, and a source of coolant selectably coupled to the reticle stage, and wherein the temperature control unit comprises a module configured to operate the at least one motor to generate heat and a valve for controlling coupling between the source of coolant and the reticle stage.

14. The apparatus of claim 2, wherein the temperature control unit comprises at least one resistive heater within the clamping structure.

15. The apparatus of claim 14, wherein the clamping structure comprises a clamping surface comprising a plurality of raised surface features, and wherein the temperature control unit comprises at least one resistive heater in at least some of the plurality of raised surface features.

16. The apparatus of claim 2, wherein the temperature control unit comprises at least one resistive heater within the cleaning reticle.

17. The apparatus of claim 16, wherein the cleaning reticle comprises a battery electrically coupled to the resistive heater.

18. The apparatus of claim 2, wherein the temperature control unit comprises at least one electrical cooling element within the cleaning reticle.

19. The apparatus of claim 18, wherein the cleaning reticle comprises a battery electrically coupled to the electrical cooling element.

* * * * *